(12) United States Patent
Gregoire et al.

(10) Patent No.: US 6,236,524 B1
(45) Date of Patent: May 22, 2001

(54) ADJUSTABLE IMPEDANCE BOOSTER

(75) Inventors: Bernard R. Gregoire, Pocatello, ID (US); Hiromichi Kuwano, Kanagawa (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/211,938

(22) Filed: Dec. 15, 1998

(51) Int. Cl.$^7$ .................................................. G11B 5/09
(52) U.S. Cl. ............................... 360/46; 360/67; 360/65; 330/261
(58) Field of Search ........................... 360/46, 65, 67; 330/252, 261

(56) References Cited

U.S. PATENT DOCUMENTS

| | | | |
|---|---|---|---|
| 5,157,559 | * 10/1992 | Gleason et al. | 360/67 |
| 5,486,794 | * 1/1996 | Wu et al. | 331/115 |
| 5,831,784 | * 11/1998 | Barnett et al. | 360/67 |
| 6,038,090 | * 3/2000 | Freitas | 360/67 |
| 6,046,875 | * 4/2000 | Siniscalchi et al. | 360/67 |

* cited by examiner

*Primary Examiner*—Alan T. Faber
(74) *Attorney, Agent, or Firm*—W. Daniel Swayze, Jr.; W. James Brady; Frederick J. Telecky, Jr.

(57) ABSTRACT

An adjustable impedance boosting circuit comprises a differential pair of gain stage transistors. A magneto-resistive element may be coupled to the emitters of the gain stage transistors, and a collector load may be coupled to a collector of at least one of the gain stage transistors. The invention further comprises a variable impedance load coupled in parallel with at least a portion of the collector load, the variable impedance load operable to adjust the impedance of the boosting circuit in proportion to the resistance of the magneto-resistive element.

15 Claims, 2 Drawing Sheets

ADJUSTABLE IMPEDANCE BOOSTER

TECHNICAL FIELD OF THE INVENTION

This invention relates generally to the field of information storage, and more particularly to a method and apparatus for increasing the bandwidth of a differential amplifier.

BACKGROUND OF THE INVENTION

As computer hardware and software technology continues to progress, the need for larger and faster mass storage devices for storing computer software and data continues to increase. Electronic databases and computer applications such as multimedia applications require large amounts of disk storage space. An axiom in the computer industry is that there is no such thing as enough memory and disk storage space. Mass storage device manufacturers strive to produce high speed hard disk drives with large data capacities at lower and lower costs.

In general, mass storage devices and systems, such as hard disk drives, include a magnetic storage media, such as rotating disks or platters, a spindle motor, read/write heads, an actuator, a pre-amplifier, a read channel, a write channel, a servo circuit, and control circuitry to control the operation of the hard disk drive and to properly interface the hard disk drive to a host system or bus. Hard disk drives typically perform read operations by locating appropriate sectors on the disk platters and reading the data that has been previously written to the disk. The read/write heads of the hard disk drive generally comprise a magneto-resistive element, which senses changes in the magnetic flux of the disk platter and generates a corresponding analog read signal. These analog signals are typically passed to a preamplifier circuit and, then, onto a read channel for conditioning, decoding and formatting of the analog signal.

The bandwidth of the system is typically limited by the lead inductance associated with the magneto-resistive read/write head. The limited bandwidth is attributable to a pole caused by the combination of the resistance and lead inductance of the magneto-resistive read/write head, which causes a roll off in the system's frequency response.

One approach to increasing the bandwidth of a hard disk drive is to introduce a zero at a frequency corresponding to the pole due to the lead inductance of the magneto-resistive element. One method of locating such a compensating zero is to implement two stages of differential amplifiers, a forward gain stage and a reverse gain stage. The gain stages are configured, such that, at low frequencies, the reverse gain stage suppresses the gain of the combination. The reverse gain stage is designed to roll-off at a particular frequency. This frequency is chosen to correspond to the pole due to the lead inductance of the magneto-resistive element. When the reverse gain stage begins to roll-off, it begins to stop suppressing the forward gain stage, effectively creating a zero in the frequency response of the combination. This zero is intended to compensate for the pole caused by the lead inductance of the magneto-resistive element and, therefore, extend the bandwidth of the system.

A problem with this approach is that typical magneto-resistive elements exhibit tolerances of up to 30 percent. In addition, actual values of magneto-resistive elements may vary with the operating temperature. Variations in the actual value of the magneto-resistive element cause corresponding variations in the location of the lead inductance pole. This approach suffers from the fact that the compensating zero is static. That is, this approach contemplates creating a compensating zero for a known, fixed value of the magneto-resistive element. Variations in actual component values may, therefore, result in mismatches between the lead inductance pole and the compensating zero, creating undesirable peaks and valleys in the system's frequency response. In addition, the compensating zero in this system is typically dependent on the base/emitter capacitance of the transistors in the reverse gain stage. This parameter is not well controlled, which further complicates accurate placement of the compensating zero.

Another approach to creating a compensating zero is to use two gain stages, where the inputs of the second gain stage are coupled to the outputs of the first gain stage. A network of resistors are coupled to the emitters of the second gain stage, with a capacitor coupled in parallel with a portion of the emitter resistance. At a particular frequency, chosen to counteract the lead inductance pole, the capacitor begins to short out a portion of emitter resistance, causing a reduction in the total emitter resistance, and an increase in the gain of the second gain stage. This creates a zero, which is intended to counteract the lead inductance pole and increase the system's bandwidth. Like the previous approach, the compensating zero is static, and unable to compensate for variations in the location of the lead inductance pole due to component tolerances and changing operating temperatures.

SUMMARY OF THE INVENTION

In accordance with the teachings of the present invention, an adjustable impedance boosting circuit is provided that substantially eliminates or reduces the disadvantages associated with prior techniques and processes.

In accordance with one embodiment of the present invention, an adjustable impedance boosting circuit comprises a differential pair of gain stage transistors. A magneto-resistive element may be coupled to the emitters of the gain stage transistors, and a collector load may be coupled to a collector of at least one of the gain stage transistors. The invention further comprises a variable impedance load coupled in parallel with at least a portion of the collector load, the variable impedance load operable to adjust the impedance of the boosting circuit in proportion to the resistance of the magneto-resistive element.

The present invention has several important technical advantages. Varying the impedance of the variable impedance load in proportion to the actual value of the magneto-resistive element facilitates adjustable compensation for a pole caused by the lead inductance of the magneto-resistive element. The invention, therefore, provides a method and apparatus for approximating a compensating zero that is responsive to variations in the actual value of the magneto-resistive element. The peak-limiting circuit prevents peaks in the frequency response by rolling off the gain of the variable impedance load at a selected frequency.

BRIEF DESCRIPTION OF THE DRAWINGS

A more complete understanding of the teachings of the present invention may be acquired by referring to the accompanying figures in which like reference numbers indicate like features and wherein.

DETAILED DESCRIPTION OF THE INVENTION

Figure 1:
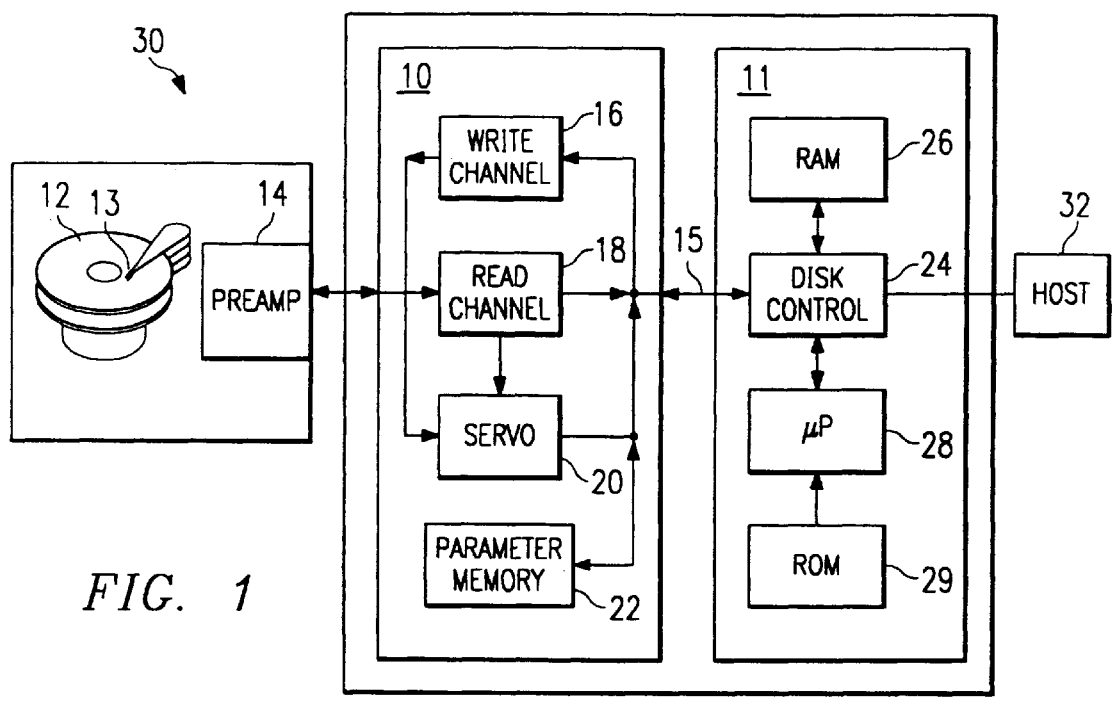
FIG. 1 is a block diagram illustrating an exemplary disk drive mass storage system.

FIG. 1 is a block diagram of a disk drive mass storage system 30 used for retrieving data during read operations and for storing data during write operations. Disk drive mass storage system 30 interfaces and exchanges data with a host 32 during read and write operations. Disk drive mass storage system 30 includes a disk/head assembly 12, a preamplifier 14, a synchronously sampled data (SSD) channel 10, and a control circuit 11. Disk/head assembly 12 and preamplifier 14 are used to magnetically store data. SSD channel 10 and control circuitry 11 are used to process data that is being read from and written to disk/head assembly 12 and to control the various operations of disk drive mass storage system 30. Host 32 exchanges digital data with control circuitry 11.

Disk/head assembly 12 includes a number of rotating magnetic disks or platters used to store data that is represented as magnetic transitions on the magnetic platters. Read/write heads 13 of disk/head assembly 12 are used to store and retrieve data from each side of the magnetic platters. Read/write heads 13 may comprise any type of available read/write heads such as magneto-resistive heads. Preamplifier 14 serves as an interface between read/write heads 13 of disk/head assembly 12 and SSD channel 10, and provides amplification to the waveform data signals as needed.

SSD channel 10 is used during read and write operations to exchange analog data signals with disk/head assembly 12 through preamplifier 14 and to exchange digital data signals with control circuitry 11 through a data/parameter path 15. SSD channel 10 includes a write channel 16, a read channel 18, a servo control 20, and a parameter memory 22. SSD channel 10 may be implemented as a single integrated circuit.

During write operations, write channel 16 receives digital data from control circuitry 11 in parallel format through data/parameter path 15. A serial format could also be used. The digital data is reformatted or coded for storage and provided to disk/head assembly 12. Write channel 16 may include a register, a scrambler, a phase locked loop, an encoder, a serializer, and a write precompensation circuit. The operation and timing of write channel 16 is controlled by a write clock signal.

During read operations, read channel 18 receives analog data signals from read/write heads 13 of disk/head assembly 12 through preamplifier 14. Read channel 18 conditions, decodes, and formats the analog data signal and provides a digital data signal in parallel format to control circuitry 11 through data/parameter path 15. Read channel 18 includes any of a variety of circuit modules such as an automatic gain control circuit, a low pass filter, a variable frequency oscillator, a sampler, an equalizer, such as a finite impulse response filter, a maximum likelihood, partial response detector, a deserializer, and a synchronization field detection circuit.

Some of the various circuit modules of read channel 18 may receive operational parameters for enhanced or optimal performance. The operational parameters are generally calculated during burn-in but may be calculated at other times. The operational parameters are designed to account for the various physical and magnetic characteristics of disk drive mass storage system 30 that vary from system to system and influence operational performance. During start-up, the operational parameters are provided to SSD channel 10 from control circuitry 11 through data/parameter path 15. Parameter memory 22 stores the operational parameters. The various circuit modules of read channel 18 may then access the operational parameters from parameter memory 22 during read operations.

Servo control 20 may provide position error signals (PES) to control circuitry 11 during read and write operations. The PES relate to the position of the heads of disk/head assembly 12 so that the heads can be properly positioned during both read and write operations.

Control circuitry 11 is used to control the various operations of disk drive mass storage system 30 and to exchange digital data with SSD channel 10 and host 32. Control circuitry 11 includes a microprocessor 28, a disk control 24, a random access memory (RAM) 26, and a read only memory (ROM) 29. Microprocessor 28, disk control 24, RAM 26, and ROM 29 together provide control and logic functions to disk drive mass storage system 30 so that data may be received from host 32, stored, and later retrieved and provided back to host 32. ROM 29 includes preloaded microprocessor instructions for use by microprocessor 28 in operating and controlling disk drive mass storage system 30. ROM 29 may also include the operational parameters, discussed above, that are supplied to parameter memory 22 during start-up. RAM 26 is used for storing digital data received from host 32 before being supplied to SSD channel 10 and received from SSD channel 10 before being supplied to host 32. RAM 26 may also provide data to microprocessor 28 and store data or results calculated by microprocessor 28. Disk control 24 includes various logic and bus arbitration circuitry used in properly interfacing disk drive mass storage system 30 to host 32 and for internally interfacing control circuitry 11 to SSD channel 10. Depending on the circuit implementation, any of a variety of circuitry may be used in disk control 24.

In operation, disk drive mass storage system 30 goes through an initialization or start-up routine when power is initially provided. One such routine instructs microprocessor 28 to supply operational parameters, previously stored in ROM 29, to parameter memory 22 of SSD channel 10 through data/parameter path 15. The operational parameters are then stored in memory registers of parameter memory 22 for use by read channel 18 during a read operation.

After the initialization routine is complete, data may be read from or written to disk/head assembly 12. Servo control 20 provides location information so that read/write heads 13 may be properly positioned on the disks to read and write data. In general, the operation of disk drive mass storage system 30 may be divided into read operations and non-read operations. Read operations involve the reading of data from the disks of disk head assembly 12 and non-read operations include write operations, servo operations, and times when the system is idle. Clock signals control both read operations and non-read-operations.

During a read operation, host 32 initiates a request for data. After the read/write heads of disk/head assembly 12 are properly positioned, an analog data signal is provided to preamplifier 14. Read channel 18 receives the analog data signal from preamplifier 14, processes the analog data signal, and provides a corresponding digital data signal. This involves using various circuitry modules and techniques for synchronously sampling the analog data signal and detecting a digital signal. A read clock signal ensures that the data signal is synchronously sampled in the correct manner. Read channel 18 provides the digital data signal to disk control 24 through data/parameter path 15. Disk control 24 provides various digital logic control and arbitration circuitry between SSD channel 10, host 32, RAM 26, microprocessor 28, and ROM 29 during both read and write operations. The digital data is then stored in RAM 26 until microprocessor 28 communicates to host 32 that the data is ready to be transferred. Host 32 may be a system bus such as the system bus of a personal computer.

During a write operation, a digital data signal is received from host 32 and ultimately stored on disk/head assembly 12. Digital data is initially provided from host 32 to control circuitry 11. Control circuitry 11 stores the digital data in RAM 26. Microprocessor 28 schedules a series of events so that the data may then be transferred from RAM 26 to disk/head assembly 12, through write channel 16. This data exchange occurs through data/parameter path 15. RAM 26 first provides the data to write channel 16. Write channel 16 encodes the digital data and places the data in serial format. Write channel 16 then provides the data to disk/head assembly 12 after read/write heads 13 of disk/head assembly 12 have been properly positioned to write or store the data at an appropriate location on the disk. The operation and timing of write channel 16 is controlled by a write clock signal.

The circuitry illustrated in FIG. 1 provides only one example of circuitry that can be used to control a disk drive. Other circuitry can be used without departing from the scope of the invention.

Figure 2:
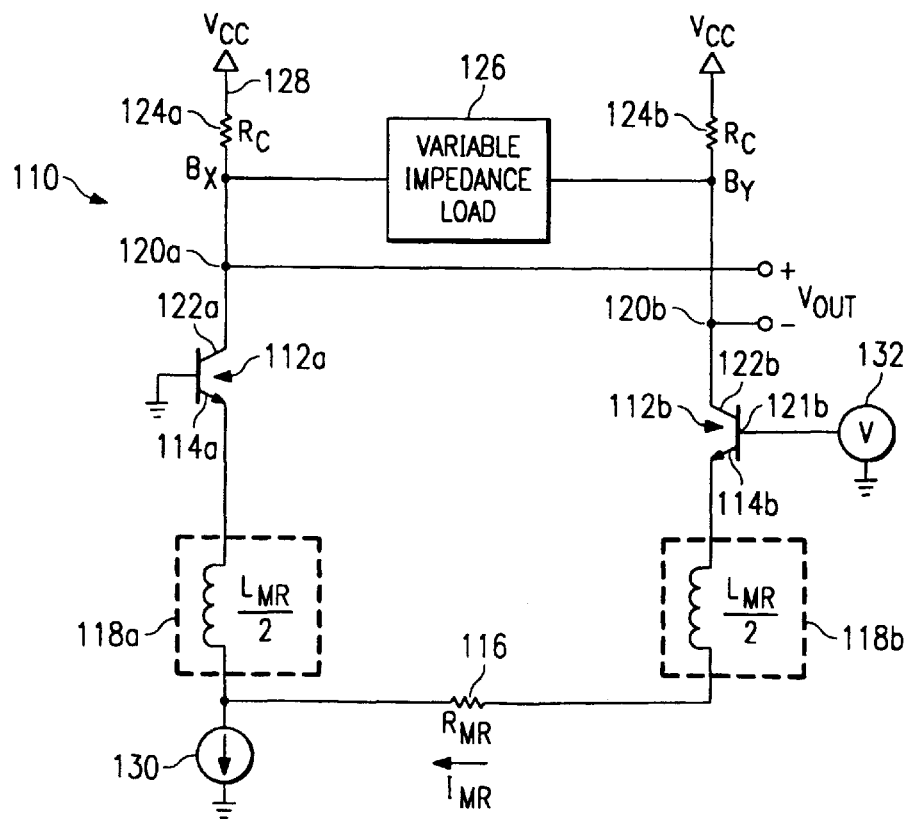
FIG. 2 is a schematic diagram of an adjustable impedance boosting circuit constructed according to the teachings of the present invention.

FIG. 2 is a schematic diagram of an adjustable impedance boosting circuit 110 constructed according to the teachings of the present invention. Adjustable impedance boosting circuit 110 may comprise a portion of preamplifier circuit 14 of FIG. 1. Adjustable impedance boosting circuit 110 may include a differential pair of gain stage transistors 112a and 112b. Gain stage transistors 112a–112b may comprise, for example, n-p-n bipolar junction transistors. Other types transistors may, however, be used without departing from the scope of the invention. A magneto-resistive element 116 may be coupled between emitters 114a and 114b of transistors 12a–12b, respectively. Magneto-resistive element 116 may comprise, for example, a read/write head of a hard disk drive. Inductance elements 118a and 118b represent magneto-resistive lead inductances associated with magneto-resistive element 116. Lead inductance elements 118a–118b, thus, are not inductors placed deliberately in circuit 110, but rather are representative of the magneto-resistive lead inductance in the circuit.

Impedance boosting circuit 110 may comprise output nodes 120a and 120b coupled to the collectors 122a–122b of transistors 112a–112b, respectively. An output signal $V_{OUT}$ may propagate from output nodes 120a–120b. Output signal, $V_{OUT}$, comprises an amplified version of an input signal to the differential pair of transistors 112a–112b, amplified by a gain factor, A. Gain factor, A, is determined by the ratio of the impedance at collectors 112a–122b of transistors 112a–112b to the impedance at the emitters 114a–114b. Collector loads 124a–124b may be coupled to collectors 122a–122b of transistors 112a–112b, respectively. In this embodiment, collector loads 124a–124b comprise resistors coupled to collectors 122a–122b of transistors 112a–112b, respectively. Alternatively, collector loads 124a–124b may comprise any combination of elements in various configurations collectively forming a collector load element.

A variable impedance load 126 may be coupled in parallel with collector loads 124a–124b at nodes $B_X$ and $B_Y$. Variable impedance load 126 may, for example, be coupled to the collector-side of collector load 124, as shown in FIG. 2. Variable impedance load 126 need not reside entirely between nodes $B_X$ and $B_Y$. In another embodiment (not explicitly shown), at least a portion of variable impedance load 126 may be coupled between node Bx and the power supply, and at least a portion may be coupled between node By and the power supply. In still another embodiment, where collector loads 124a–124b comprise combinations of resistors (not explicitly shown), variable impedance load 126 may be coupled between individual elements of collector loads 124a–124b. Any combination of variable impedance load 126 coupled in parallel with at least a portion of collector loads 124a–124b may be used without departing from the scope of the invention.

Transistors 112a–112b may be biased with a current source 130 coupled to emitter 114a of transistor 112a, and a voltage source 132 coupled to base 121b of transistor 112b. The magnitude of voltage source 132 may be chosen, for example, to provide equal currents through transistors 112a and 112b. Other biasing schemes may be used without departing from the scope of the invention. For example, a separate current source may be coupled to each emitter 114a and 114b on either side of magneto-resistive element 116 (not explicitly shown). In that case, base 121b of transistor 112b may be coupled to ground.

As described above, magneto-resistive element 116 may comprise a portion of a read/write head in a hard disk drive. In operation, magneto-resistive element 116 may sense changes in the magnetic field as the read/write head reads data from the disk platter. As the magnetic field changes, the resistance of magneto-resistive element 116 also changes. The gain factor, A, of differential pair of transistors 112a–112b, is determined by the ratio of the impedance at the collectors 122a–122b to the impedance at the emitters 114a–114b. Changes in the resistance of magneto-resistive element 116 due to fluctuations in the magnetic field cause corresponding changes in gain factor A and, thus, output voltage VOUT of the differential pair.

Magneto-resistive element 116 has a lead inductance $L_{MR}$ associated with it. The combination of magneto-resistive element 116 and its lead inductance 118a–118b creates a pole in the frequency response of the system, limiting the bandwidth of the device. It is often desirable to increase the bandwidth of the system by implementing circuitry operable to create a zero in the frequency response of the system to counteract the pole caused by the lead inductance of magneto-resistive element 116. Typical magneto-resistive elements 116 may exhibit tolerances of up to 30%, which result in corresponding variances in the location of the pole caused by the lead inductance of magneto-resistive element 116. In addition, the actual value of magneto-resistive element 116 may vary with the operating temperature of the device. Because the locations of the lead inductance pole vary with actual values of magneto-resistive elements, typical static compensation schemes often fail to provide effective compensation. It is, therefore, desirable that the circuitry for approximating the compensating zero be operable to adjust the characteristics of the approximated compensating zero in response to variations in tolerance levels of the magneto-resistive elements.

Variable impedance load 126 operates to approximate an adjustable compensating zero to offset the pole created by the lead inductance of magneto-resistive element 116. The characteristics of the approximated compensating zero may be specifically tailored depending on actual magneto-resistive value. The frequency at which the approximated compensating zero occurs may be determined by selection of component values within variable impedance load 126. The magnitude of the compensating gain introduced by variable impedance load 126 may be controlled by adjusting the impedance of variable impedance load 126 in proportion to the actual value of the resistance of magneto-resistive element 116. Variable impedance load 126 may comprise any circuitry operable to vary its impedance in proportion to the actual value of the resistance of magneto-resistive element 116. For example, variable impedance load 126 may comprise circuitry operable to create a negative impedance at nodes $B_X$ and $B_Y$, to effect an overall increase in the impedance of the parallel combination of collector load 124 and variable impedance load 126. Specific details of the structure and function of variable impedance load 126 will be described later in this document.

Figure 3:
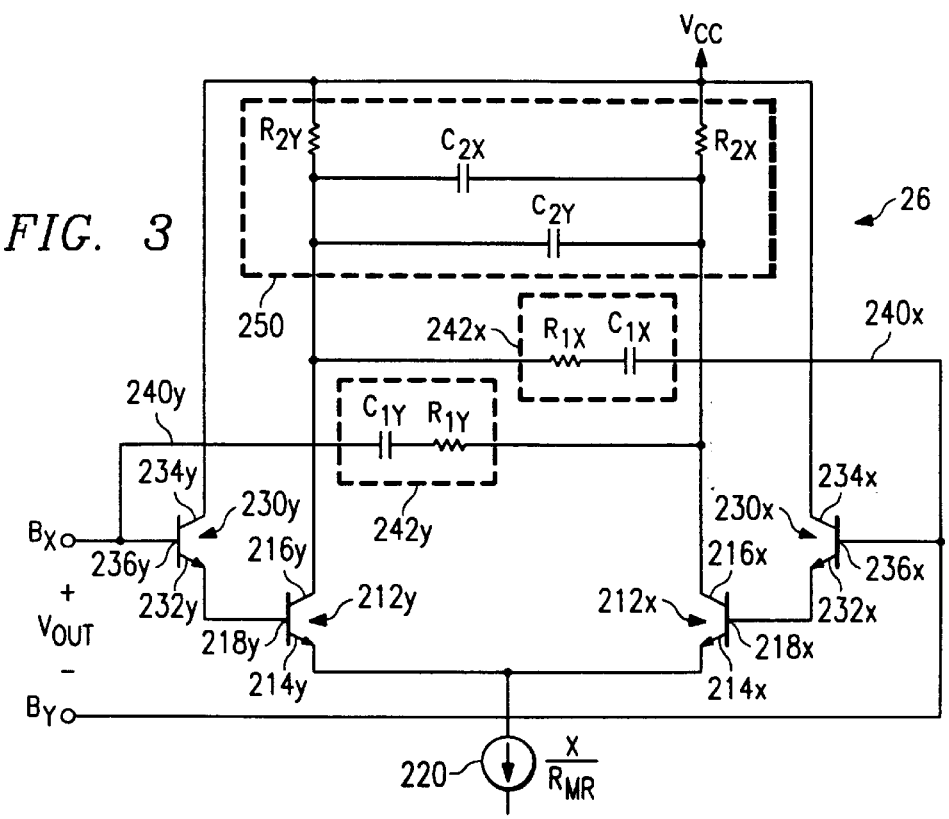
FIG. 3 is a schematic diagram of a variable impedance load circuit constructed according to the teachings of the present invention.

FIG. 3 is a schematic diagram of variable impedance load 126 constructed according to the teachings of the present invention. Variable impedance load 126 may include a first differential pair of transistors 212x–212y having emitters 214x–214y coupled to an impedance-controlling current source 220. Variable impedance load 126 may further include a second differential pair of transistors 230x–230y having emitters 232x–232y coupled to bases 218x–218y of transistors 212x–212y, respectively. Collectors 216x–216y and 234x–234y of first and second differential pairs 212x–212y and 230x–230y, respectively, may be coupled to a bias voltage $V_{CC}$.

A positive feedback network 240x may be coupled between base 236x of transistor 230x and collector 216y of transistor 212y. Similarly, a positive feedback network 240y may be coupled between base 236y of transistor 230y and collector 216x of transistor 212x. Positive feedback networks 240x–240y may include first positive feedback element 242x and second positive feedback element 242y, respectively. First and second positive feedback elements 242x–242y may comprise, for example, a resistor/capacitor network. Specifically, first and second positive feedback elements 242x–242y may comprise resistors $R_{1x}$ and $R_{1y}$ coupled in series with capacitors $C_{1x}$ and $C_{1y}$, respectively. As will be described below, particular values of components within positive feedback networks 240x–240y may be selected to achieve particular characteristics in the frequency response of variable impedance load 126.

Variable impedance load circuit 126 may further include a peak-limiting circuit 250 coupled to collectors 216x–216y of transistors 212x–212y and collectors 234x–234y of transistors 230x–230y, respectively. Peak-limiting circuit 250 may comprise any circuit operable to create a pole in the frequency response of variable impedance load circuit 126 at a selected frequency. In one embodiment, peak-limiting circuit 250 may comprise capacitors $C_{2x}$ and $C_{2y}$, coupled in parallel between collectors 216x and 216y of transistors 212x and 212y, respectively. Peak-limiting circuit 250 may further comprise resistors $R_{2x}$ and $R_{2y}$, coupled between capacitor $C_{2x}$ and collectors 234x–234y of transistors 230x–230y, respectively.

An impedance controlling current source 220 may be coupled to bases 214x–214y of transistors 212x–212y, respectively. Impedance controlling current source 220 may comprise voltage-sensing circuitry (not explicitly shown) operable to determine the voltage, $V_{MR}$, across magneto-resistive element 116. The voltage $V_{MR}$ may be determined, for example, by observing the differential voltage at bases 121a–121b of transistors 112a–112b, respectively (FIG. 1). Impedance controlling current source circuitry 220 may further include current-sensing circuitry operable to determine the current $I_{MR}$ through magneto-resistive element 116. Current-sensing circuitry (not explicitly shown) may include a current mirror coupled in parallel with current source 130. Any circuitry operable to sense the current through magneto-resistive element 116 may be used without departing from the scope of the invention.

Impedance controlling current source circuitry 220 may still further include current-generating circuitry operable to generate a current signal $$\frac{x}{R_{MR}},$$

which is proportional to the actual value of the resistance of magneto-resistive element 116. Current generating circuitry (not explicitly shown) may comprise, for example, a Gilbert multiplier, which receives voltage $V_{MR}$ from the voltage sensing circuitry and current $I_{MR}$ from the current sensing circuitry. The Gilbert multiplier may multiply voltage $V_{MR}$ by an inverted version of current $I_{MR}$ to produce a signal $$\frac{x}{R_{MR}},$$

which is proportional to the actual value of the resistance of magneto-resistive element 116. A Gilbert multiplier is only one example of circuitry that may be used to generate a signal proportional to the actual value of the resistance of the magneto-resistive element 116. Other circuits could be used without departing from the scope of the invention.

In operation, variable impedance load circuit 126 operates to approximate a compensating zero in the frequency response of adjustable impedance boosting circuit 110, which compensates for the effects of the pole caused by the lead inductance of magneto-resistive element 116. Variable impedance load 126, therefore, extends the bandwidth of adjustable impedance boosting circuit 110. The present invention, unlike prior approaches, provides a system and method of compensating for magneto-resistive-induced poles, while providing variable compensation levels to account for variations in the actual value of magneto-resistive element 116.

In general, adjustable impedance boosting circuit 110 operates to increase the bandwidth of the system by approximating a compensating zero $Z_{COMPENSATE}$, which is adjustable in proportion to the actual value of the resistance of magneto-resistive element 116. The magnitude of the gain attributable to the approximated compensating zero is controlled by adjustment of the impedance of variable impedance load 126, which is coupled in parallel with collector load 124. By creating a negative impedance at nodes $B_x$ and $B_y$, variable impedance load 126 increases the impedance of the parallel combination, and thus, increases the gain of the differential pair. Varying the magnitude of the negative impedance in proportion to the actual value of the resistance of magneto-resistive element 116 facilitates variable compensation levels. The approximated zero is said to be "approximated," because variable impedance load 126 may introduce a greater increase in the system's frequency response than an actual zero would. To avoid peaks in the resultant system frequency response, a peak-limiting circuit 250 may be coupled to variable impedance load 126. Peak-limiting circuit 250 operates to create a pole at a desired frequency to control the gain provided by variable impedance load 126. Variable impedance load 126 and peak limiting circuit 250 may operate in combination to approximate a compensating zero near the rolloff frequency caused by the lead inductance of the system. Details of peak-limiting circuit 250 will be described below.

Referring to FIG. 3, at very low frequencies, first and second positive feedback elements 242x and 242y act essentially as open circuits, preventing positive feedback between first and second differential pairs 212x–212y and 230x–230y, respectively. At low frequencies, therefore, adjustable impedance boosting circuit 110 sees a positive impedance between nodes $B_X$ and $B_Y$. At higher frequencies, capacitors $C_{1X}$ and $C_{1Y}$ begin to allow positive feedback to transistors 230x and 230y, which reduces the impedance seen between nodes $B_X$ and $B_Y$. At some frequency, this positive feedback creates a negative impedance between nodes $B_X$ and $B_Y$. The point at which the impedance between nodes $B_x$ and $B_y$ becomes negative represents an approximated compensating zero, $Z_{COMPENSATE}$, of the circuit. This point is determined primarily by selection of component values in positive feedback elements 242x–242y.

The frequency of the approximated compensating zero, $Z_{COMPENSATE}$, would ideally be set at the frequency of the pole due to the lead inductance of magneto-resistive element 116. As described above, however, typical magneto-resistive elements may exhibit tolerances of up to 30%. In addition, actual values of magneto-resistive element 116 may fluctuate due to temperature changes. These variations causes corresponding variances in the location of the poles associated with the lead inductance of magneto-resistive element 116. In one embodiment, the frequency of approximated compensating zero $Z_{COMPNSATE}$ may be selected to correspond to an average value of magneto-resistive element 116. This may facilitate placement of approximated compensating zero $Z_{COMPENSATE}$ near the pole caused by the lead inductance of magneto-resistive element 116.

In addition to controlling the placement of the approximated compensating zero, variable impedance load circuit 126 facilitates adjustment of the magnitude of the gain associated with the approximated compensating zero. The magnitude of the compensating gain depends upon the amount of negative impedance seen between nodes $B_X$ and $B_Y$. The larger the negative impedance between nodes $B_X$ and $B_Y$, the larger the impedance of the parallel combination of the collector loads 124 and variable impedance load 126. Larger overall collector impedance corresponds to a larger gain in the differential amplifier of adjustable impedance boosting circuit 110. Thus, by controlling the amount of negative impedance seen between nodes $B_X$ and $B_Y$, variable impedance load circuit 126 may control gain factor, A, of adjustable impedance boosting circuit 110.

The level of negative impedance at nodes $B_X$ and $B_Y$ depends on the transconductance $g_m$ of transformers 212x–212y and 230x–230y. The transconductance depends on the current $$\frac{x}{R_{MR}}$$

feeding positive feedback paths 240x–240y. As described above, current signal $$\frac{x}{R_{MR}}$$

may be proportional to the actual value of the resistance of magneto-resistive element 116. Current signal $$\frac{x}{R_{MR}}$$

may be generated though any appropriate circuitry. In one embodiment, impedance-controlling current source 220 may include, for example, a Gilbert multiplier (not explicitly shown) operable to receive a signal proportional to the voltage, $V_{MR}$, and a signal proportional to the current, $I_{MR}$. The Gilbert multiplier may multiply the signal proportional to voltage $V_{mr}$ by an inverse of a signal proportional to current $I_{MR}$, to generate a signal $$\frac{x}{R_{MR}}$$

proportional to the actual value of the resistance of magneto-resistive element 116.

To avoid peaks in the frequency response of the system, peak-limiting circuit 250 may be implemented. Peak-limiting circuit 250 may create a pole in the frequency response of the differential amplifier to counteract the effect of the approximated compensating zero at a desire frequency. The specific location of the peak-limiting pole may be controlled through selection of components within peak-limiting circuit 250.

Controlling the impedance, and thus, the gain of variable impedance load 126 through a current source that is proportional to the actual value of the resistance of magneto-resistive element 116 facilitates automatic compensation for various values of magneto-resistive element 116. FIGS. 4a–4d show exemplary frequency responses of compensated and uncompensated systems.

Figure 4A:
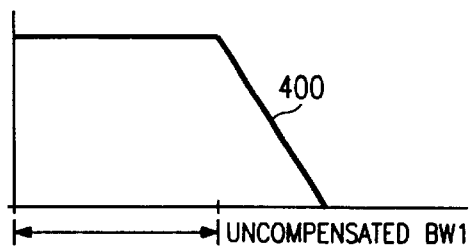
FIG. 4a shows an exemplary frequency response of an exemplary differential amplifier.

FIG. 4a shows an exemplary frequency response of an uncompensated differential amplifier having a bandwidth, $BW_1$.

Figure 4B:
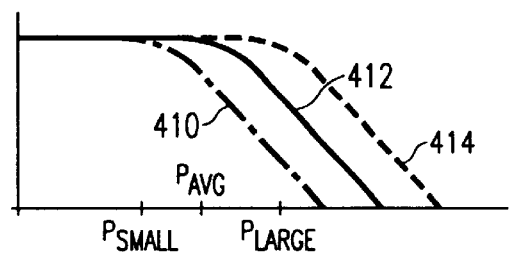
FIG. 4b shows exemplary frequency responses of a differential amplifier having various levels of magneto-resistive components.

FIG. 4b shows exemplary frequency responses of uncompensated differential amplifiers having magneto-resistive elements of various values. For example, frequency response 410 represents an amplifier having a small magneto-resistive component. Frequency response 412 represents an amplifier having a mid-range magneto-resistive component. Frequency response 414 represents an amplifier having a high magneto-resistive component. As shown, the smaller the magneto-resistive component, the sooner frequency rolls off at the lead inductance pole.

Figure 4C:
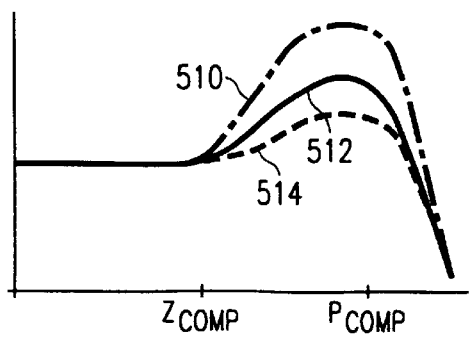
FIG. 4c shows exemplary frequency responses of a variable impedance load circuit constructed according to the teachings of the present invention.
Figure 4D:
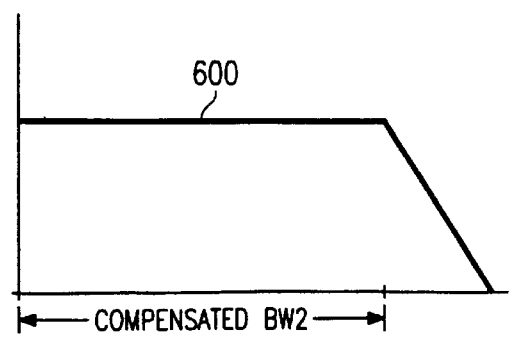
FIG. 4d shows an exemplary frequency response of an exemplary adjustable impedance boosting circuit constructed according to the teachings of the present invention.

FIG. 4c shows exemplary frequency responses of a variable impedance load circuit constructed according to the teachings of the present invention. As described above, an approximated compensating zero, $Z_{COMPENSATE}$, may be introduced at a frequency near the frequency of the lead inductance pole. For example, approximated compensating zero $Z_{COMPENSATE}$ may be placed at a frequency corresponding to the pole associated with an average value of typical magneto-resistive elements. The magnitude of the compensating gain may then be adjusted, depending on the actual value of 116 magneto-resistive element 116, to provide a smooth resulting frequency response shown in FIG. 4d. For example, frequency response 510 depicts a high-magnitude compensating gain necessary to compensate for the early frequency roll off 410 due to a small magneto-resistive component. Frequency response 512 shows a mid-magnitude compensating gain used to compensate for the average frequency roll off 412 caused by an average magneto-resistive component. Frequency response 514 shows a low-magnitude compensating gain for compensating the frequency roll off 412 caused by a higher than average magneto-resistive component. Adjustable impedance boosting circuit 110 provides an increased resultant bandwidth $BW_2$, regardless of variations in the actual values of different magneto-resistive elements.

Although the present invention has been described in detail it should be understood that various changes and substitutions may be made hereto without departing from the scope of the present invention as defined by the appended claims.

What is claimed is:

1. An adjustable impedance boosting circuit, comprising:
a differential pair of gain stage transistors;
a magneto-resistive element coupled to the emitters of the gain stage transistors;
a collector load coupled to a collector of at least one of the gain stage transistors;
a variable impedance load coupled in parallel with at least a portion of the collector load, the variable impedance load operable to adjust the impedance of the boosting circuit in proportion to the resistance of the magneto-resistive element, wherein the variable impedance load comprises a positive feedback network having an approximated zero in its frequency response located near a pole of the adjustable impedance boosting circuit, the pole of the boosting circuit caused by lead inductance of the magneto-resistive element.

2. An adjustable impedance boosting circuit, comprising:
a differential pair of gain stage transistors;
a magneto-resistive element coupled to the emitters of the gain stage transistors;
a collector load coupled to a collector of at least one of the gain stage transistors;
a variable impedance load coupled in parallel with at least a portion of the collector load, the variable impedance load operable to adjust the impedance of the boosting circuit in proportion to the resistance of the magneto-resistive element, wherein the variable impedance load comprises:
an impedance-controlling current source operable to generate a current signal that is proportional to the resistance of the magneto-resistive element;
a positive feedback network operable to receive the current signal from the impedance-controlling current source and provide a negative value of the impedance of the variable impedance load.

3. The adjustable impedance boosting circuit of claim 2, wherein the variable impedance load comprises:
a first differential pair of transistors, each having its emitter coupled to the impedance-controlling current source;
a second differential pair of transistors, each having its emitter coupled to the base of one of the transistors of the first differential pair;
a first positive feedback element coupled between the base of one of the transistors of the first pair and the collector of one of the transistors of the second pair;
a second positive feedback element coupled between the base of the other transistor of the first pair and the collector of the other transistor of the second pair.

4. The adjustable impedance boosting circuit of claim 3, wherein the variable impedance load comprises a peak-limiting circuit coupled between the collectors of the first differential pair of transistors.

5. The adjustable impedance boosting circuit of claim 4, wherein the peak-limiting circuit comprises a capacitor chosen to create a pole in the frequency response of the variable impedance load to avoid a peak in the frequency response of the adjustable impedance boosting circuit.

6. A disk drive ha a storage device comprising:
a head operable to interface with said storage device; and
a preamplifier circuit coupled to the read head, the preamplifier circuit including an adjustable impedance boosting circuit;
the adjustable impedance boosting circuit comprising:
a differential pair of gain stage transistors;
a magneto-resistive element of said head coupled to the emitters of the gain stage transistors;
a collector load coupled to a collector of at least one of the gain stage transistors;
a variable impedance load coupled in parallel with at least a portion of the collector load, the variable impedance load operable to adjust the impedance of the boosting circuit in proportion to the resistance of the magneto-resistive element, wherein the variable impedance load comprises a positive feedback network having an approximated zero in its frequency response located near a pole of the adjustable impedance boosting circuit, the pole of the boosting circuit caused by lead inductance of the magneto-resistive element.

7. A disk drive having a storage device comprising:
a head operable to interface with said storage device; and
a preamplifier circuit coupled to the read head, the preamplifier circuit including an adjustable impedance boosting circuit;
the adjustable impedance boosting circuit comprising:
a differential pair of gain stage transistors;
a magneto-resistive element of said head coupled to the emitters of the gain stage transistors;
a collector load coupled to a collector of at least one of the gain stage transistors;
a variable impedance load coupled in parallel with at least a portion of the collector load, the variable impedance load operable to adjust the impedance of the boosting circuit in proportion to the resistance of the magneto-resistive element, wherein the variable impedance load comprises:
an impedance-controlling current source operable to generate a current signal that is proportional to the resistance of the magneto-resistive element;
a positive feedback network operable to receive the current signal from the impedance-controlling current source and provide a negative value of the impedance of the variable impedance load.

8. The disk drive of claim 7, wherein the variable impedance load comprises:
a first differential pair of transistors, each having its emitter coupled to the impedance-controlling current source;
a second differential pair of transistors, each having its emitter coupled to the base of one of the transistors of the first differential pair;
a first positive feedback element coupled between the base of one of the transistors of the first pair and the collector of one of the transistors of the second pair;

a second positive feedback element coupled between the base of the other transistor of the first pair and the collector of the other transistor of the second pair.

9. The disk drive of claim 8, wherein the variable impedance load comprises a peak-limiting circuit coupled between the collectors of the first differential pair of transistors.

10. The disk drive of claim 9, wherein the peak limiting circuit comprises a capacitor chosen to create a pole in the frequency response of the variable impedance load to avoid a peak in the frequency response of the adjustable impedance boosting circuit.

11. A method of increasing the bandwidth of a differential amplifier, comprising:

approximating a zero in the frequency response of the differential amplifier near the frequency of a pole caused by lead inductance of a magneto-resistive element coupled between the emitters of a differential pair of gain stage transistors;

determining an actual value of the resistance of the magneto-resistive element; and adjusting the impedance of a variable impedance load in proportion to the actual value of the resistance of the magneto-resistive element, the variable impedance load coupled in parallel with at least a portion of a collector load of the differential amplifier.

12. A The method of claim 11, wherein approximating a zero in the frequency response of the differential amplifier comprises selecting values of components of the variable impedance load to approximate the zero at a specified frequency.

13. The method of claim 11, wherein adjusting the impedance of a variable impedance load comprises:

receiving at a positive feedback network of the variable impedance load, a current signal that is proportional to the actual value of the resistance of the magneto-resistive element; and positively feeding back at least a portion of the current signal to create a negative impedance coupled in parallel with the collector load.

14. The method of claim 11 further comprising limiting the frequency response of the differential amplifier to avoid peaks in the frequency response of the differential amplifier.

15. The method of claim 14, wherein limiting the frequency response comprises creating a pole in the frequency response of the differential amplifier at a frequency above the frequency of the approximated zero.

* * * * *

UNITED STATES PATENT AND TRADEMARK OFFICE
CERTIFICATE OF CORRECTION

PATENT NO.    : 6,236,524 B1
DATED         : May 22, 2001
INVENTOR(S)   : Bernard R. Gregoire and Hiromichi Kuwano Page 1 of 1

It is certified that error appears in the above-identified patent and that said Letters Patent is hereby corrected as shown below:

<u>Title page,</u>
Insert the following after "Related U.S. Applications Data": Provisional Application No. 60/069,486 filed December 15, 1997.

Signed and Sealed this

Twenty-ninth Day of January, 2002

*Attest:*

*Attesting Officer*

JAMES E. ROGAN
*Director of the United States Patent and Trademark Office*